(12) United States Patent
Kondo et al.

(10) Patent No.: US 7,064,405 B2
(45) Date of Patent: Jun. 20, 2006

(54) SOLID STATE IMAGING DEVICE WITH INNER LENS AND MANUFACTURE THEREOF

(75) Inventors: Ryuji Kondo, Miyagi (JP); Shinji Uya, Miyagi (JP); Yuko Nomura, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 38 days.

(21) Appl. No.: 10/823,660

(22) Filed: Apr. 14, 2004

(65) Prior Publication Data

US 2005/0045975 A1 Mar. 3, 2005

(30) Foreign Application Priority Data

Aug. 26, 2003 (JP) ............................. 2003-301663

(51) Int. Cl.
*H01L 31/0232* (2006.01)
(52) U.S. Cl. .......................................... 257/436; 438/69
(58) Field of Classification Search ........ 257/290–292, 257/294, 432, 436; 438/29, 60, 69, 70, 73–75

See application file for complete search history.

(56) References Cited

U.S. PATENT DOCUMENTS 6,255,640 B1 * 7/2001 Endo et al. ............... 250/208.1

FOREIGN PATENT DOCUMENTS

JP 05-206430 8/1993

* cited by examiner

*Primary Examiner*—David Vu
(74) *Attorney, Agent, or Firm*—Arent Fox PLLC

(57) ABSTRACT

A semiconductor structure is formed which has photosensors, vertical CCDs, a horizontal CCD and a light shielding film. A first insulating layer made of additive-containing silicon oxide is formed on the semiconductor structure. It is reflowed and upward and downward convex inner lenses are formed on the reflowed first insulating layer and above the photosensors. A second insulating layer is formed which covers the inner lenses and is made of silicon oxide based insulator. It is planarized. Color filters are formed on the planarized surface of the second insulating layer. A transparent flat layer made of transparent material is formed covering the color filters. Micro lenses are formed on the transparent flat layer. A low refractive index layer having a refractive index lower than the micro lenses is formed covering the micro lenses. A transparent plate is disposed on it. The semiconductor structure disposed with the transparent plate is packaged.

7 Claims, 10 Drawing Sheets

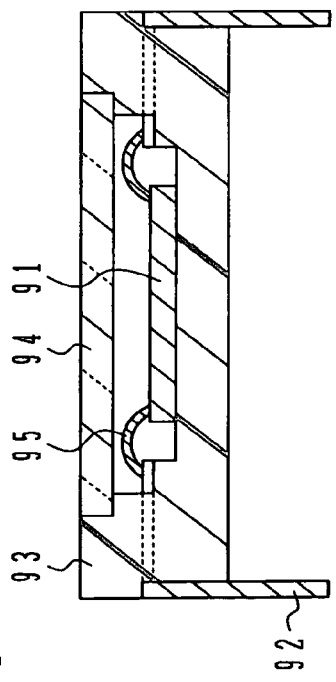
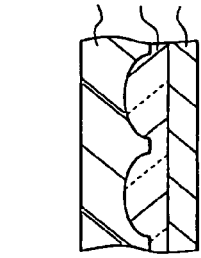
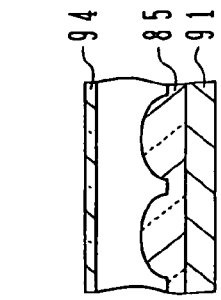
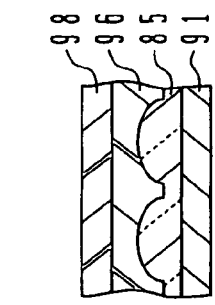
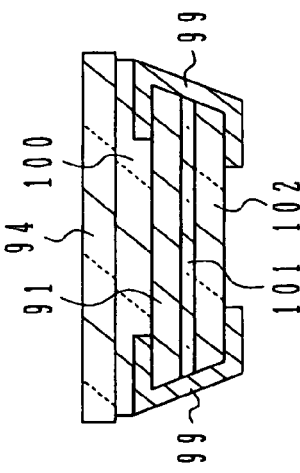
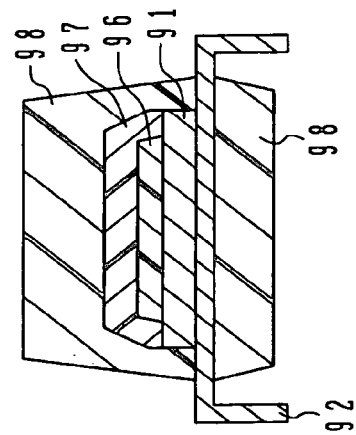
FIG. 7A
FIG. 7B
FIG. 7C
FIG. 7D
FIG. 7E
FIG. 7F

SOLID STATE IMAGING DEVICE WITH INNER LENS AND MANUFACTURE THEREOF

CROSS REFERENCE TO RELATED APPLICATION

This application is based on and claims priority of Japanese Patent Application No. 2003-301663 filed on Aug. 26, 2003, the entire contents of which are incorporated herein by reference.

BACKGROUND OF THE INVENTION

A) Field of the Invention

The present invention relates to a solid state imaging device, and more particularly to a packaged solid state imaging device and a manufacture method thereof.

B) Description of the Related Art

FIG. 5A is a block diagram showing the main part of a solid state imaging apparatus and FIG. 5B is a schematic plan view showing the configuration of a solid state imaging device.

As shown in FIG. 5A, the solid state imaging apparatus is constituted of: a solid state imaging device 51; a drive signal generator 52, an output signal processor 53; a storage 54; a display 55; a transmitter 56; and a television 57. The solid state imaging device 51 generates signal charges corresponding in amount to the amount of incident light upon each pixel and supplies an image signal corresponding to the generated signal charges. The drive signal generator 52 generates a drive signal (transfer voltage and the like) for driving the solid state imaging device 51 and supplies it to the solid state imaging device 51. The output signal processor 53 processes the image signal supplied from the solid state imaging device 51 to perform noise reduction, white balance, data compression and the like. The storage 54 is connected to the output signal processor 53 and stores the image signal. The storage 54 may be a memory card. The display 55 displays the image signal and may be a liquid crystal display. The transmitter 56 transmits the image signal to an external. The television 57 displays the image signal when necessary.

Solid state imaging devices are generally classified into a CCD type and a MOS type. The CCD type transfers charges generated in pixels by CCDs. The MOS type amplifies charges generated in pixels by MOS transistors and then outputs an image signal. In the following, the CCD type is used by way of example and not restrictively.

Signals to be supplied from the drive signal generator 52 to the solid state imaging device 51 include a horizontal CCD drive signal, a vertical CCD drive signal, an output amplifier drive signal and a substrate bias signal.

As shown in FIG. 5B, the solid state imaging device is constituted of: a plurality of photosensors 62 disposed, for example, in rows and columns; a plurality of vertical charge coupled devices (VCCDs) 64; a horizontal charge coupled device (HCCD) 66 electrically coupled to vertical CCDs 64; a drive circuit (and wirings) 65 for driving CCDs; and an amplifier (floating diffusion) 67 disposed at the end of the horizontal CCD 66 for converting an output charge signal into voltage. A pixel arranged area 61 includes the photosensors 62 and vertical CCDs 64.

Each photosensor 62 is a photoelectric conversion element. The photoelectric conversion element generates and accumulates signal charges corresponding in amount to an incident light amount. The accumulated signal charges are read to the vertical CCD 64, and transferred in the vertical CCD 64 toward the horizontal CCD 66 in the vertical direction. The vertical CCD 64 transfers signal charges in response to a transfer voltage (drive signal) supplied from the drive circuit 65. The signal charges transferred to the end of the vertical CCD 64 are transferred in the horizontal CCD (horizontal transfer channel) 66, converted into voltage by the amplifier 67 and output to an external.

FIG. 6A is a plan view showing the outline of a partial area of the pixel arranged area 61 of the solid state imaging device, and FIG. 6B is a cross sectional view taken along line 6B—6B shown in FIG. 6A. For the simplicity of drawing, some constituent elements shown in FIG. 6B are omitted in FIG. 6A.

As shown in FIG. 6A, a vertical transfer channel 73 is disposed between photosensors 62 adjacent in the horizontal direction. A first-layer polysilicon transfer electrode 71 and a second-layer polysilicon transfer electrode 72 are disposed covering the channels 73, and overlapped at their one ends along the channel longitudinal direction. Both the polysilicon transfer electrodes extend generally along the direction perpendicular to the longitudinal direction of the vertical transfer channel 73. The transfer electrodes made of two stacked electrode layers occupy the smaller areas between photosensors adjacent in the vertical direction. For example, four-phase drive signals (transfer voltages) are applied to a unit of four or eight transfer electrodes 71, 72, 71, 72 to transfer signal charges generated in the photosensors 62 in the vertical transfer channel 73.

As shown in FIG. 6B, an n-type charge accumulation region 62 constituting the photosensor and the adjacent n-type vertical transfer channel 73 are disposed in a p-type well 82 formed in a semiconductor substrate 81 of, for example, an n-type. The first-layer polysilicon transfer electrode 71 is formed on an insulating layer 74 above the vertical transfer channel 73. After an insulating layer such as a thermally oxidized film is formed covering the first-layer polysilicon electrode, the second-layer polysilicon transfer electrode 72 is formed overlapping the first polysilicon transfer electrode 71 at their end portions. The surface of the second-layer transfer electrode is also electrically insulated by a thermally oxidized film or the like. The first-layer and second-layer transfer electrodes are alternately disposed along the longitudinal direction of the vertical transfer channels. The vertical CCD 64 is constituted of the vertical transfer channel 73 and upper level insulating film 74, first-layer transfer electrode 71 and second-layer transfer electrode 72.

The n-type transfer channel 73 and p-type well 82 form a pn junction so that when light becomes incident thereon, pairs of electrons and holes are formed and noises are generated. In order not to make light incident on an area other than the photosensors, a light shielding film 83 having openings above the photosensors and made of tungsten or the like covers the first and second polysilicon electrodes. At this stage of manufacture, only the insulating layer 74 exists above the light receiving area of the charge accumulation region 62. Stacked above the vertical channel 73 are the insulating layer 74, first and/or second silicon electrodes 71 and 72 (having overlapped areas between pixels adjacent in the vertical direction and at end portions of the transfer electrodes above the vertical channel), and light shielding film 83. At this stage of manufacture, the uppermost surface has the curved surface increasing its height from the substrate surface toward the outside area of the light receiving area.

Signal charges generated in the photosensor 62 corresponding in amount to the incident light amount are read to the vertical transfer channel 73 in response to a read voltage applied to the first-layer transfer electrode 71, and thereafter transferred in the vertical transfer channel 73 in response to the transfer signal (transfer voltage) applied to each of the first-layer and second-layer transfer electrodes 71 and 72. The shielding film 83 with openings above the photosensors 62 prevents light incident upon the pixel arranged area from becoming incident upon the area other than the photosensors 62.

Three primary color filters 84 of red (R), green (G) and blue (B) are formed on an insulating layer 105 made of, for example, silicon oxide (SiO). On the color filters 84, micro lenses 85 made of, for example, photoresist, are formed. The micro lens 85 is disposed above each photosensor 62 and is, for example, a semispherical fine convex lens. For example, the refractive index of the micro lens 85 is 1.6 to 1.7. The micro lens 85 converges incident light at the photosensor 62. Light converged by the micro lens 85 passes through the corresponding one of the three primary color filters 84 and becomes incident upon the photosensor 62. In this specification, the structure having the light shielding film 83, insulating layer 105 and color filters 84 above the photosensor 62 and vertical CCD 64 and having also a function of supporting the micro lenses 85, is called a micro lens support layer 106 where appropriate.

SUMMARY OF THE INVENTION

An object of this invention is to provide a solid state imaging device and its manufacture method.

According to one aspect of the present invention, there is provided a method of manufacturing a solid state imaging device, comprising: (a) forming photosensors, disposed on a semiconductor substrate in a matrix shape, for photoelectrically converting incident light into signal charges, and forming a light shielding film above the photosensors, the light shielding film having openings and increasing a height from a surface of the semiconductor substrate near the openings; (b) forming a first insulating layer on the semiconductor substrate, the first insulating layer covering the light shielding film and being made of additive-containing silicon oxide; (c) reflowing the first insulating layer to form downward convex curved surfaces; (d) forming upward and downward convex inner lenses on the reflowed first insulating layer above the openings, the inner lens being made of silicon nitride; (e) forming a second insulating layer covering the inner lenses, the second insulating layer having a planarized surface and being made of silicon oxide based insulator; (f) forming color filters on the planarized surface of the second insulating layer; (g) forming a planarizing layer of transparent material covering the color filters; (h) forming micro lenses on the planarizing layer; and (i) forming a low refractive index layer covering the micro lenses, the low refractive index layer having a refractive index lower than a refractive index of the micro lens.

With this solid state imaging device manufacture method, a solid state imaging device having a high converging factor can be manufactured.

According to another aspect of the present invention, there is provided a solid state imaging device comprising: a semiconductor substrate having: photosensors disposed in a matrix shape for photoelectrically converting incident light into signal charges; vertical transfer channels for transferring the signal charges generated in the photosensors in a vertical direction; and a horizontal transfer channel for transferring the signal charges supplied from the vertical transfer channels in a horizontal direction; first and second electrodes formed above the vertical transfer channels and extending in a direction crossing the vertical transfer channels; a light shielding film formed above the first and second electrodes; upward and downward convex inner lenses made of silicon nitride, at the height level above the photosensors and at a process level after forming the light shielding film; micro lenses formed above the inner lenses; a low refractive index layer covering the micro lenses, the low refractive index layer having a refractive index lower than a refractive index of the micro lenses; and a transparent plate disposed on the low refractive index layer.

In this solid state imaging device, since the low refractive index layer is formed covering the micro lenses, a flat surface can be formed and the transparent plate such as a glass plate can be disposed stably. Since incident light is converged on the photosensors by using two lenses, micro lens and inner lens, the amount of light incident upon the photosensor can be increased. A high converging efficiency can therefore be obtained. A compact and inexpensive solid state imaging device can be provided.

It is possible to provide a solid state imaging device having a high converging factor and its manufacture method.

BRIEF DESCRIPTION OF THE DRAWINGS

FIGS. 7A to 7F are schematic cross sectional views showing packaged solid state imaging chips.

DESCRIPTION OF THE PREFERRED EMBODIMENTS

Figure 1:
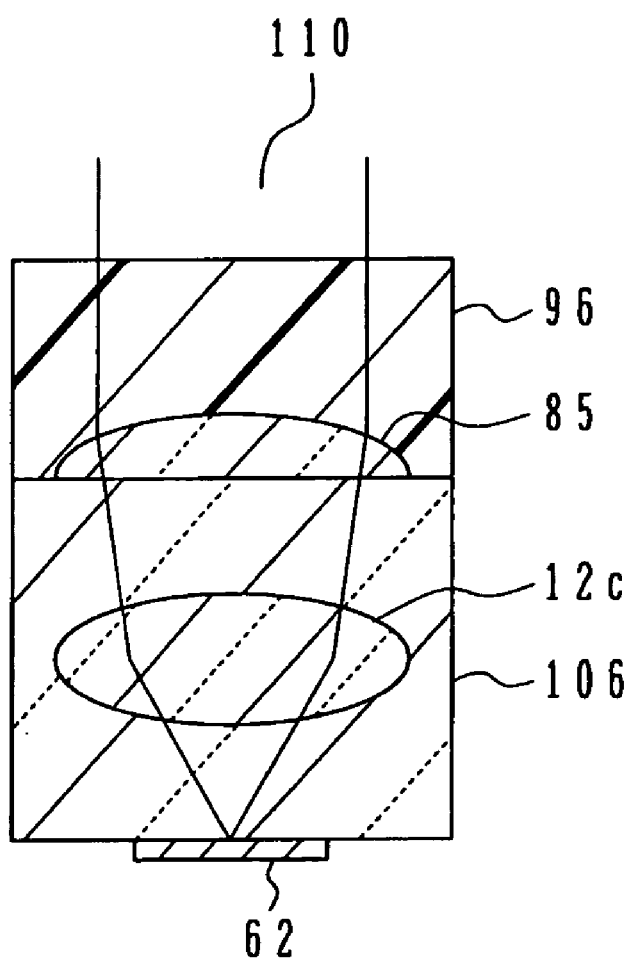
FIG. 1 is a cross sectional view showing the outline of a partial area of a solid state imaging device.

Studies made by the present inventors will be explained prior to describing the present embodiments.

FIGS. 7A to 7F are schematic cross sectional views showing packaged solid state imaging devices.

As shown in FIG. 7A, a solid state imaging chip 91 is bonded to a die pad of a lead frame in a package 93 having leads 92, and the electrical connections between the leads 92 and pads are made by bonding wires 95. A cover glass 94 is disposed on the packet 93. External light passes through the cover glass 94 and becomes incident upon the solid state imaging chip 91. Such packaged solid state imaging devices are associated with some problems that the size of the package 93 is larger than that of the solid state imaging chip 91 and the price of the package is high.

Clear resin packages and packages of wafer level chip scale packaging (WL-CSP) are know as inexpensive packages.

FIG. 7B is a cross sectional view showing an example of a clear resin package. Solid state imaging devices packaged by clear resin have been improved and proposed in various ways (for example, refer to Japanese Patent Laid-open Publication No. HEI-5-206430).

Micro lenses of a solid state imaging chip 91 are covered with a low refractive index layer 96 of fluorine resin or the like having a refractive index of 1.3 to 1.4. The side wall and upper surface of the low refractive index layer 96 are all covered with a high rigidity transparent member 97 of acrylic resin or the like. The high rigidity transparent member 97 and solid state imaging chip 91 are packaged by a clear resin layer 98 made of epoxy resin or the like. Leads 92 support the solid state imaging chip 91 and extend outside of the clear resin layer 98.

The function of the low refractive index layer 96 will be described with reference to FIGS. 7C to 7E. Although micro lenses 85 of a solid state imaging chip 91 are shown in FIGS. 7C to 7E, they are not shown in FIGS. 7A, 7B and 7F for the simplicity of drawings.

FIG. 7C shows the structure that micro lenses 85 of a solid state imaging chip 91 are directly covered with a clear resin layer 98.

FIG. 7D shows the hollow type structure that a cover glass 94 is disposed over micro lenses 85 of a solid state imaging chip 91 and an air layer exists between the cover glass and micro lenses.

FIG. 7E shows the structure that a low refractive index layer 96 covers micro lenses 85 of a solid state imaging chip 91 and a clear resin layer 98 is formed on the low refractive index layer 96.

The structure shown in FIG. 7C has a low converging factor because a refractive index difference between the clear resin layer 98 and micro lenses 85 is small. This converging factor is a half of or smaller than that of the hollow type structure shown in FIG. 7D. The structure shown in FIG. 7E has a large refractive index difference at the lens interface because the low refractive index layer 96 covers the micro lenses 85, so that incident light can be efficiently converged at the photosensor of the solid state imaging chip.

The solid state imaging chip in a clear resin package with the low refractive index layer 96 has the simple structure that only the low refractive index layer 96 is formed between the micro lenses 85 and clear resin layer 98. This solid state imaging chip can therefore realize a high sensitivity and a low cost.

As shown in FIG. 7F, adhesive layers 100 and 101 transparent to, for example, visual light, are formed on both sides of a solid state imaging chip 91. A cover glass 94 and a back glass 102 are bonded to the adhesive layers 100 and 101 on the solid state imaging chip 91, respectively. Electrode layers (leads) 99 extend out of the package of the solid state imaging chip 91. For example, the electrode leads 99 extending out of the solid state imaging chip 91 are formed after forming the adhesive layer 101 on the bottom of the solid state imaging chip 91 and the back glass 102 on the adhesive layer 101. Thereafter, the adhesive layer 100 is formed on the other side of the chip 91 and the cover glass 94 of the adhesive layer 100 is formed on the adhesive layer 100.

The WL-CSP package shown in FIG. 7F has the simple structure that the cover glass 94 and back glass 102 are formed on the adhesive layers 100 and 101 on both sides of the solid state imaging chip 91 and the electrode leads 99 are extended out of the solid state imaging chip 91.

Figure 8A:
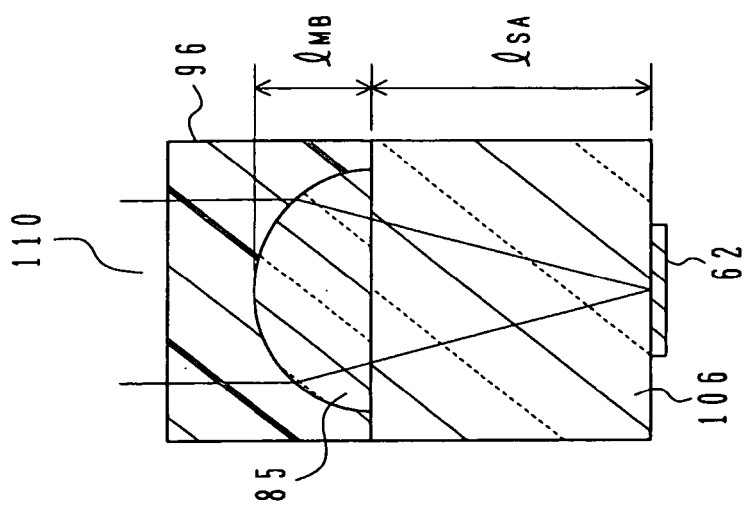
FIGS. 8A to 8C are schematic cross sectional views explaining studies made by the present inventors on solid state imaging devices having micro lenses covered with low refractive index layers.
Figure 8B:
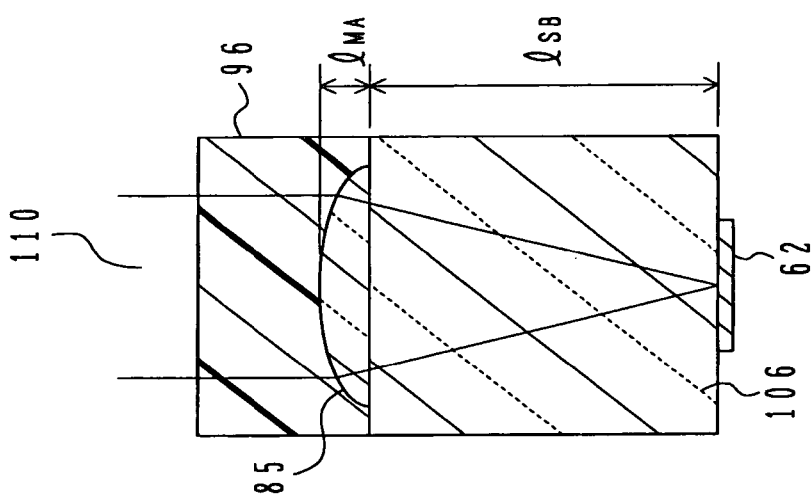
Figure 8C:
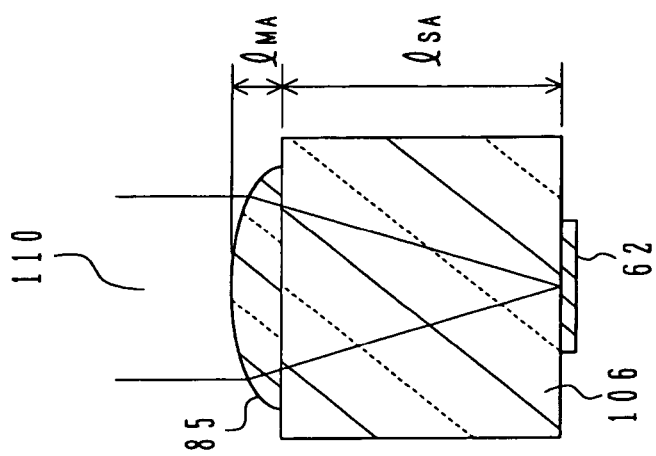

FIGS. 8A to 8C are schematic cross sectional views explaining some problems associated with packaged solid state imaging devices having micro lenses covered with low refractive index layers, such as the packaged solid state imaging chip shown in FIG. 7B.

As shown in FIG. 8A, on a photosensor 62, a micro lens support layer 106 having a thickness of $I_{SA}$ is formed, and an upward convex micro lens 85 having a thickness of $I_{MA}$ is formed on the top surface of the micro lens support layer 106. For example, the thickness $I_{MA}$ of the micro lens 85 is 1.2 μm, and the refractive index thereof is 1.6 to 1.7. Light 110 becomes incident upon the micro lens 85 and is focussed on the photosensor 62. The thickness $I_{MA}$ of the micro lens 85 and the thickness $I_{SA}$ of the micro lens support layer 105 are set to such values as the light 110 incident upon the micro lens 85 is focussed on the photosensor 62.

If the size of the photosensor 62 is 4 μm square for example, the thickness $I_{SA}$ of the micro lens support layer 106 is 3.5 μm. The thickness of the micro lens support layer 106 is reduced as the size of the photosensor is made small. For example, if the photosensor 62 is 3 μm square, the thickness of the micro lens support layer 106 is 3 μm.

As shown in FIG. 8B, if a low refractive index layer 96 having a refractive index of, for example, 1.3 to 1.4 is formed covering the micro lens 85 shown in FIG. 8A, the thickness of the micro lens support layer 106 is required to be set to $I_{SB}$ thicker than $I_{SA}$ in order to make the incident light 110 converge at the photosensor 62.

If the refractive index of the micro lens 85 is 1.7 and that of the low refractive index layer 96 covering the micro lens is 1.3, the thickness $I_{SB}$ of the micro lens support layer 106 is 7 μm for the photosensor 62 of 4 μm square. This thickness is about a twofold of when the low refractive index layer 96 is not formed.

It is however difficult to make the thickness of the micro lens support layer 106 increase by 50% or more. If the thickness exceeds this value, an optical length for the incident light 110 to reach the photosensor 62 becomes long so that some disadvantages such as scattering may occur.

As shown in FIG. 8C, the thickness of the micro lens 85 shown in FIG. 8A and covered with the low refractive index layer 96 may be set to $I_{MA}$ thicker than $I_{MA}$ in order to make the incident light 110 converge at the photosensor 62.

If the refractive index of the micro lens 85 is 1.7 and that of the low refractive index layer 96 covering the micro lens is 1.3, the thickness $I_{MB}$ of the micro lens 85 is 2.4 μm for the photosensor 62 of 3 μm square. This thickness is a twofold of $I_{MA}$.

It is also difficult to make the micro lens 85 too thick. For example, if the micro lens 85 is 1.2 μm thick, it is difficult to change the thickness more than 0.6 μm.

It is preferable that the material of the low refractive index layer 96 meets the two conditions: it is transparent to visual light (having a transmission factor of 95% or larger), and it can prevent transmission of moisture content in order to ensure the reliability of the photosensor. From this reason, material having a refractive index of 1.4 or larger is often used as the material of the low refractive index layer 96. The refractive index of the micro lens 85 is about 1.6 at the largest in practical use. A refractive index difference between the micro lens 85 and low refractive index layer 96 is small so that it is difficult to make the incident light 110 focus on the photosensor 62 by adjusting only the thickness of the micro lens 85.

FIG. 1 is a schematic cross sectional view showing a partial area of a solid state image pickup device. The overall configuration of the solid state imaging device is similar to those described with reference to FIGS. 5A, 5B, 6A and 6B, excepting the interlayer insulating film 105, and the description is not given in duplicate. A micro lens support layer 106 including an insulating layer made of silicon oxide (SiO) is formed on a photosensor 62. An upward and downward convex inner lens 120 is embedded in the micro lens support layer 106. The inner lens is made of silicon nitride (SiN) and its refractive index relative to visual light is 1.8 or larger, e.g., 2.0.

A micro lens 85 is formed on the top surface of the micro lens support layer 106. The micro lens 85 is made of, for example, photoresist and has a thickness of 0.5 μm and a refractive index of 1.6. A low refractive index layer 96 made of, for example, fluorine polymer is formed covering the micro lens 85. The refractive index of the low refractive index layer 96 is smaller than that of the micro lens 85, e.g., 1.4.

As light 110 becomes incident upon the solid state imaging device, the incident light 110 is converged by the micro lens 85 and inner lens 120 and focussed on the photosensor 62. Since light is converged by two lenses, the incident light 110 can be converged by a shorter optical length than when light is converged only by the micro lens 85. By forming the inner lens 120, the micro lens 85 can be made thin, e.g., 0.5 μm or thinner. The inner lens 120 converges the incident light 110 upon the solid state imaging device so that a larger amount of light can be focussed on the photosensor 62 and smear or the like can be mitigated.

The solid state imaging device having the inner lens 120 is suitable for use with, for example, a camera built in a portable phone. This is because the camera built in a portable phone has a short pupil distance of 3 to 4 mm and a large incidence angle of light.

In order to reduce smear, it is preferable to make small an aperture for the incident light 110 (for example, if the photosensor 62 is 3 μm square, the aperture is set to 1 μm square or smaller). It is preferable to use the inner lens 120 of an upward and downward convex shape in order to make the incident light 110 focus on the photosensor 62 even if the aperture is made small.

The solid state imaging device described above has the inner lens 120 in the micro lens support layer 106 and the micro lens 85 on the micro lens support layer 106 covered with the low refractive index layer 96. Since the micro lens 85 is covered with the low refractive index layer 96, the solid state imaging device has a higher converging factor than that of the solid state imaging device having the clear resin layer 98 covering the micro lens 85. Since the incident light 110 can be focussed on the photosensor 62 by using two lenses, the micro lens 85 and inner lens 120, a higher converging factor can be realized. For example, this converging factor is the same level as that of the solid state imaging device of the hollow type that the micro lens 85 contacts directly air.

Figure 5A:
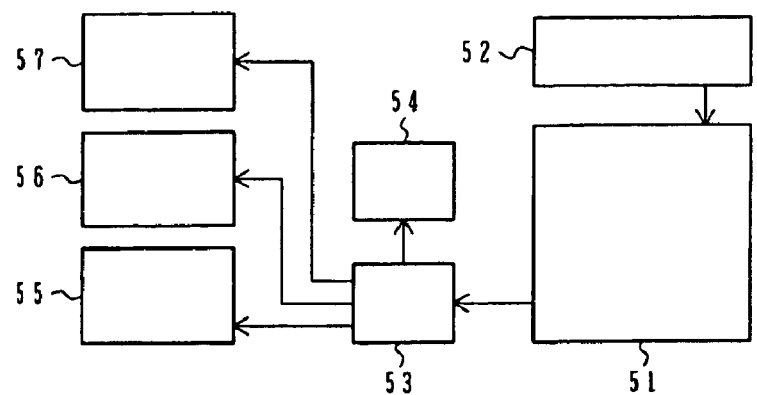
FIG. 5A is a block diagram showing a main part of a solid state imaging apparatus having a built-in solid state imaging device.
Figure 5B:
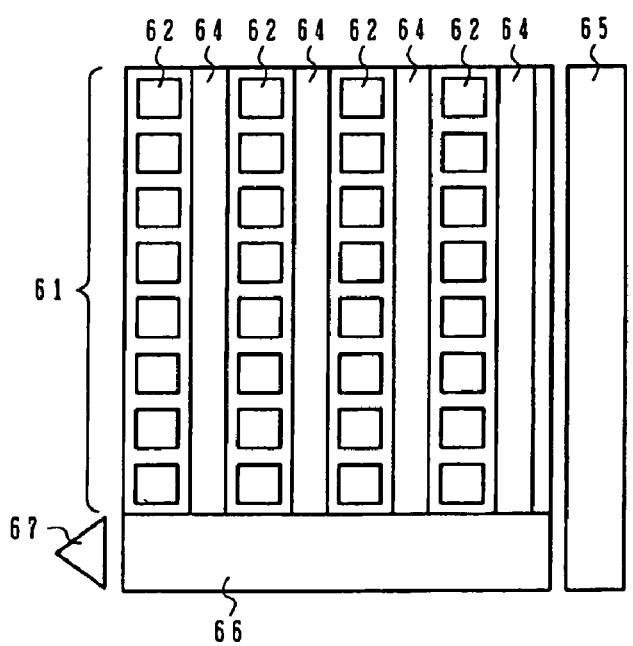
FIG. 5B is a schematic plan view showing the configuration of a solid state imaging device.
Figure 6A:
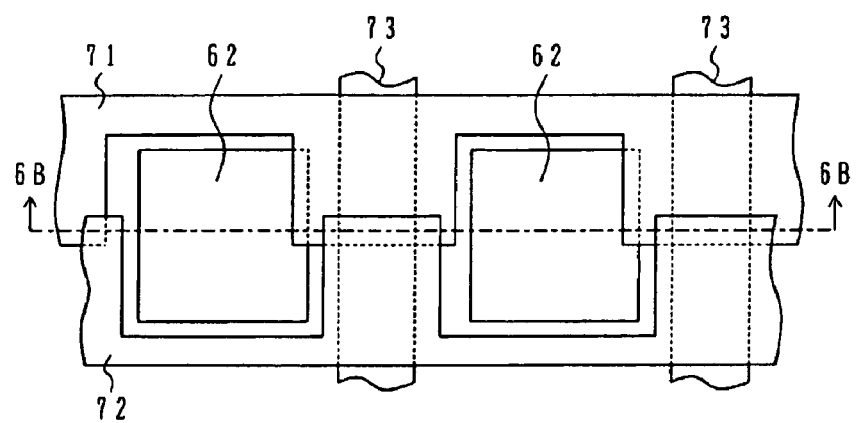
FIG. 6A is a schematic plan view showing a partial area of a pixel arranged area of a solid state imaging device.
Figure 6B:
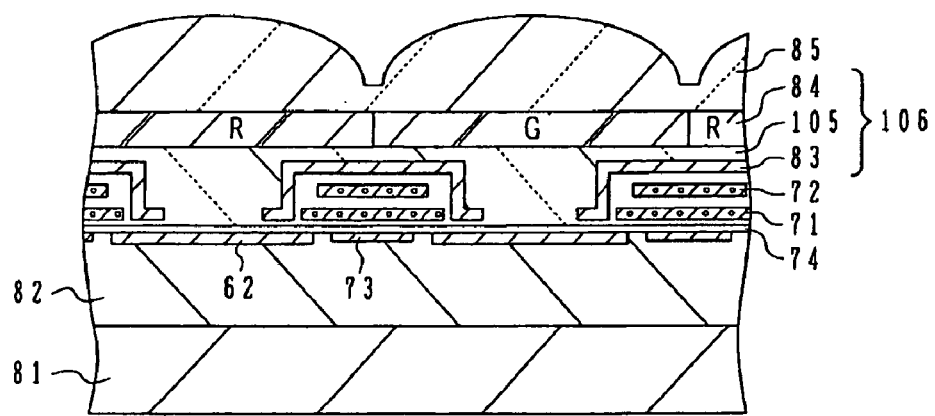
FIG. 6B is across sectional view taken along line 6B—6B shown in FIG. 6A.

A manufacture method for the packaged solid state imaging device shown in FIG. 1 will be described briefly. Photosensors 62, vertical CCDs 64, a drive circuit 65, a horizontal CCD 66, an amplifier 67 and the like similar to those shown in FIG. 5B are formed on a semiconductor substrate, e.g., a silicon substrate A micro lens support layer 106 is formed on the substrate. Inner lenses 120 are formed by an intermediate process during the process of forming the micro lens support layer 106. Micro lenses 85 are formed on the micro lens support layer 106, and a low refractive index layer 96 is formed covering the micro lenses 85. The inner lens 120 and micro lens 85 are disposed in such a manner that incident light 110 can be focussed on the photosensor 62. The method of forming the micro lens support layer 106, micro lens 85, low refractive index layer 96 and the like will be later described.

Figure 2A:
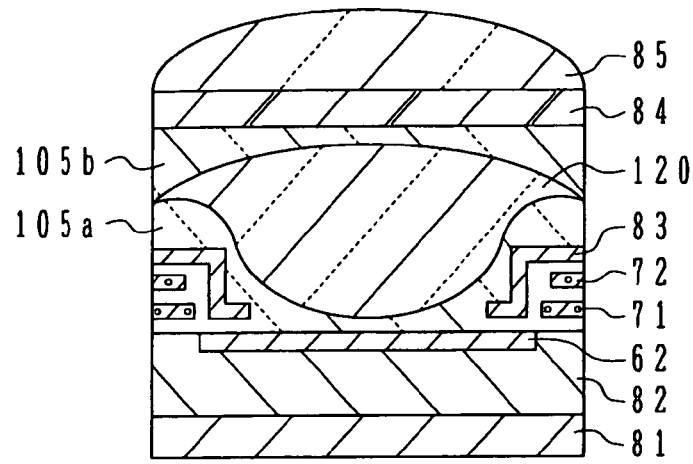
FIG. 2A is a cross sectional view showing a partial area of a pixel arranged area of a solid state imaging device.
Figure 2B:
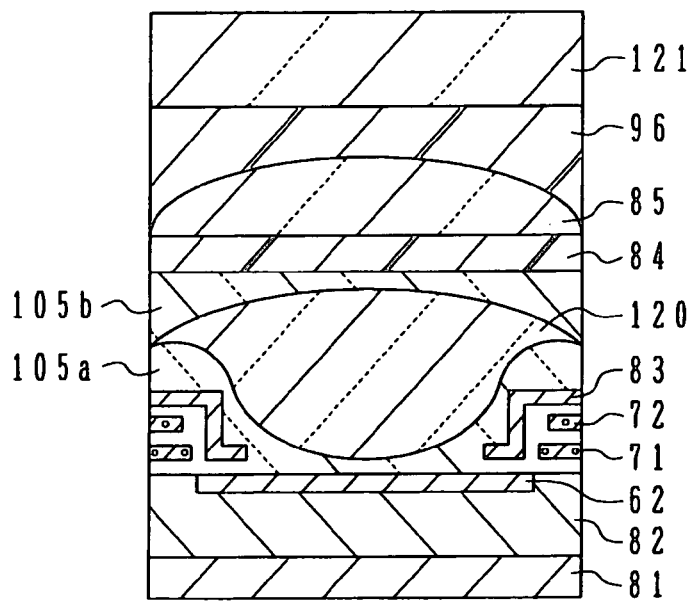
FIG. 2B is a schematic cross sectional view showing a partial area of a pixel arranged area of a solid state imaging device according to a first embodiment.
Figure 2C:
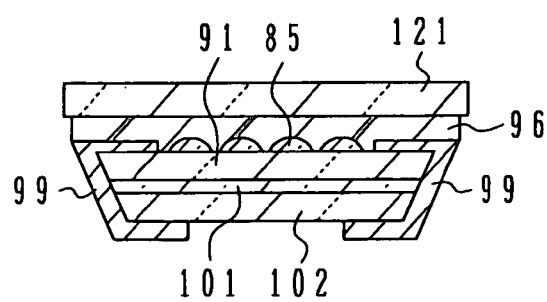
FIG. 2C is a schematic cross sectional view showing the whole of a packaged solid state imaging device.

FIGS. 2A to 2C are cross sectional views showing more specifically a partial area of the pixel arranged area of a solid state imaging device. The solid state imaging device shown in FIG. 2A corresponds to the solid state imaging device shown in FIG. 6B in that an upward and downward convex inner lens 120 is embedded in the interlayer insulating film 105 of the micro lens support layer 106. By embedding the inner lens 120 in the interlayer insulating film 105, the film 105 is divided into a lower interlayer insulating film 105a and an upper interlayer insulating film 105b. An upper surface of the lower interlayer insulating film 105a defines the downward convex lens plane. This curved plane can be formed by utilizing a stepped structure of a light shielding film 83. For example, a layer having the shape conformal to the underlying layer is deposited and reflowed to form a gently curved surface. The upper surface of the inner lens can be formed through etching using a mask. The inner lenses 120 are formed at the same pitch as that of the photosensors 62, e.g., a pitch of 3 μm or shorter, at the height level above the photosensors 62 and at a process level after forming the light shielding film 83 (after the light shielding film 83 and lower interlayer insulating film 105a are formed, the inner lenses 120 are formed. The thickness of the inner lens ranges from the level higher than the highest surface of the light shielding film 83 to the level lower than the highest surface). The structure other than the inner lens 120 is the same as that of the solid state imaging device shown in FIG. 6B.

For example, if the photosensor 62 is 3 μm square, the thickness of the inner lens 120 is about 1 μm. The thickness of the inner lens 120 is proportional to the size of the photosensor 62. The thickness of the inner lens 120 is preferably in a range of 0.5 to 1.5 μm. If the inner lens 120 is made too thick, incident light may be scattered and the converging function is degraded, and it takes a long time to manufacture the inner lenses 120. If the inner lens 120 is too thin, the converging factor lowers.

As shown in FIG. 2B, a low refractive index layer 96 is formed covering the micro lenses 85. A flat transparent glass plate 121 is formed on the low refractive index layer 96. The transparent plate 121 is made of the material transparent to visual light. Instead of the glass plate, a transparent plastic plate or the like may be used. The transparent plastic plate has a durable surface and packaging is simple.

Since the micro lens 85 is covered with the low refractive index layer 96, a refractive index difference at the lens interface can be made larger than if the micro lens is covered with resin such as epoxy resin, so that the converging efficiency of the micro lens 85 relative to the incident light 110 can be improved. The converging efficiency of the micro lens 85 relative to the incident light 110 is not influenced by the refractive index of the transparent plate 121. The converging efficiency of light output from the micro lens can be improved by the inner lens 120. The incident light can be converged on the photosensor 62. Even if incident light is inclined, the converging efficiency can be maintained.

FIG. 2C is a schematic cross sectional view showing the overall structure of a solid state imaging device in a WL-CSP package. In FIG. 2C, micro lenses 85 of a solid state imaging chip 91 are drawn exaggeratedly to facilitate the understanding of the drawing.

A rear glass layer 102 (insulating protection plate) is disposed on an adhesive layer 101 formed on the bottom of the solid state imaging chip 91. A plurality of electrode leads 99 electrically connected to the solid state imaging chip 91 (semiconductor substrate) extend from the chip upper surface to the bottom surface of the rear glass layer 102. A low refractive index layer 96 is formed on the surface of the solid state imaging chip 91 (on the side of the micro lenses 85), covering the micro lenses 85. A transparent plate 121 is disposed on the low refractive index layer 96. The packaged solid state imaging chip shown in FIG. 2C can efficiently converge light incident upon the transparent plate 121 at the photosensor 62.

FIGS. 3A to 3J illustrate the main processes of a manufacture method for a solid state imaging device having an inner lens structure.

Figure 3A:
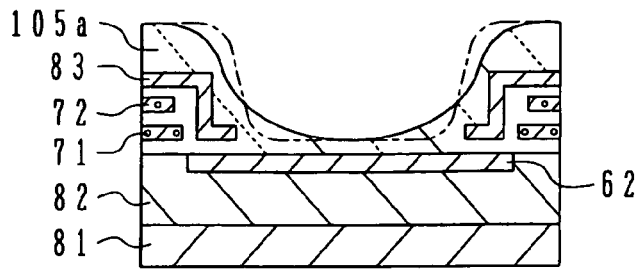
FIGS. 3A to 3J are schematic cross sectional views illustrating a method of manufacturing a solid state imaging device having the structure shown in FIG. 2B.

As shown in FIG. 3A, an n-type well 82, n-type charge accumulation regions 62, vertical CCDs 64, a drive circuit 65, a horizontal CCD 66, an amplifier 67 and the like are formed on an n-type semiconductor substrate 81 such as a silicon substrate, by the processes similar to those described earlier. Thereafter, a light shielding film 83 having openings is formed. A borophosphosilicate glass (BPSG) layer is deposited on the photosensors 62 and light shielding film 83 by chemical vapor deposition (CVD). The deposited layer is reflowed at a temperature of, for example, 800° C. to form a lower insulating layer 105a having a smoothly curved surface. Since the lower insulating layer 105a is softened, fluidized and deformed in a surface area reduction manner, the downward convex shape of the inner lens can be defined. In FIG. 3A, the lower insulating layer 105a before reflow is indicated by a one-dot chain line, and that after reflow is indicated by a solid line. Silicon oxide such as phosphosilicate glass (PSG) whose melting point was lowered by additive may be used instead of BPSG.

Figure 3B:
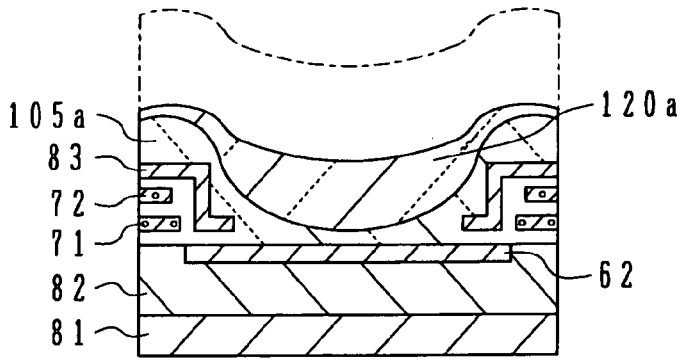

As shown in FIG. 3B, a silicon nitride film (SiN) is deposited on the lower insulating layer 105a by vapor deposition to a thickness sufficient for burying the step above the photosensor 62. The silicon nitride film on the lower insulating layer 105a is etched back by almost the whole thickness thereof to obtain a generally flat surface. Planarization may be performed by chemical mechanical polishing (CMP) or the like instead of etch-back. In this manner, the downward convex lower inner lens 120a is formed. In FIG. 3B, the silicon nitride film (SiN) before etch-back is indicated by a one-dot chain line, and the lower inner lens 120a after etch-back is indicated by a solid line.

Figure 3C:
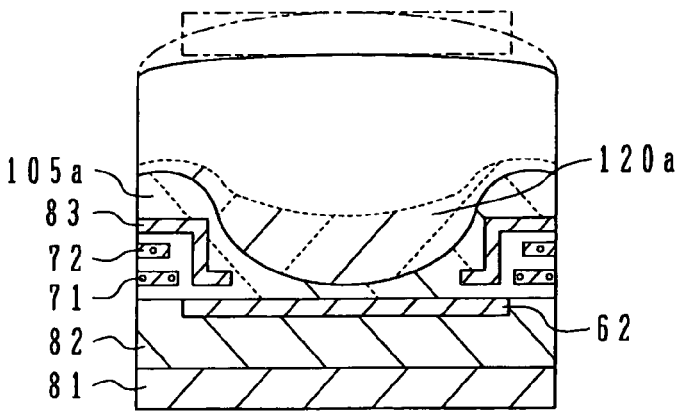

As shown in FIG. 3C, a silicon nitride film (SiN) is deposited thick on the lower inner lens 120a by vapor deposition. The contour of the silicon nitride film is indicated by a solid line. On this deposited silicon nitride film, a photoresist film is coated and exposed and developed to form a resist pattern. Thereafter, heat treatment is performed at a temperature of 250° C. under a photoresist curing temperature of 220° C. to form photoresist films of a lens shape. In FIG. 3C, the photoresist pattern is indicated by a one-dot-chain line, and the photoresist film after heat treatment is indicated by a two-dot-chain line. The degree of freedom of designing the upward curve of the inner lens is high because the resist pattern is used.

Figure 3D:
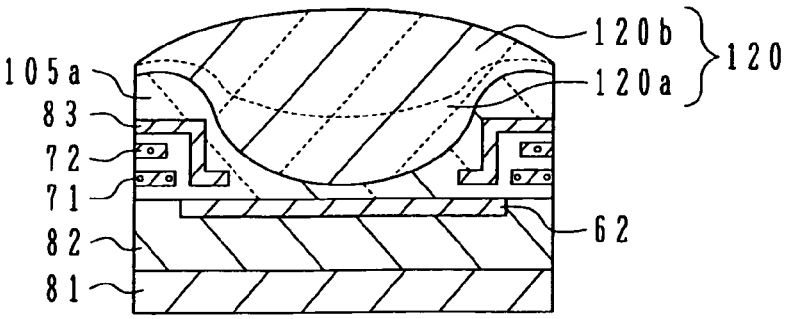

As shown in FIG. 3D, by using the lens-shaped photoresist film as a mask, the silicon nitride film is anisotropically etched to (proportionally) transfer the resist pattern shape to the silicon nitride film to thereby form an upward convex upper inner lens 120b.

A combination of the upper inner lens 120b and lower inner lens 120a forms an upward and downward convex inner lens 120.

Figure 3E:
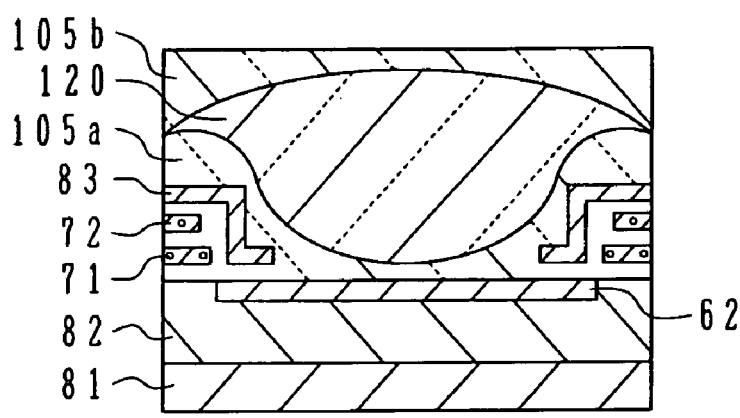

As shown in FIG. 3E, a BPSG film is deposited on the inner lens 120 by vapor deposition and reflowed at a temperature of, for example, 850° C. to planarize the surface thereof and form an upper insulating layer 105b. Instead of BPSG and reflow, planarization may be performed by using an insulating film which contains silicon oxide and by CMP.

Figure 3F:
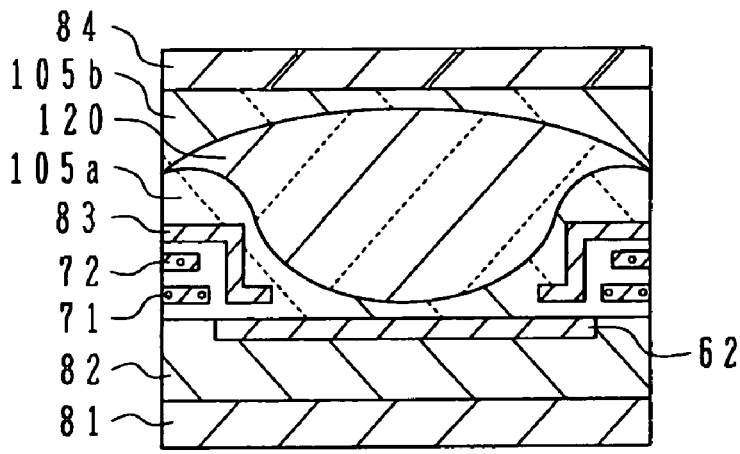

As shown in FIG. 3F, color filters 84 are formed on the upper insulating layer 105b. The color filter 84 is formed by coating photoresist solution mixed or dispersed with granular pigment (dye), exposing and developing it and thermally curing at a temperature of, for example, 220° C. to form color filter patterns. Filters of three colors, red (R), green (G) and blue (B) are sequentially formed. It is difficult to prevent a step at side walls of the filters from being formed.

Figure 3G:
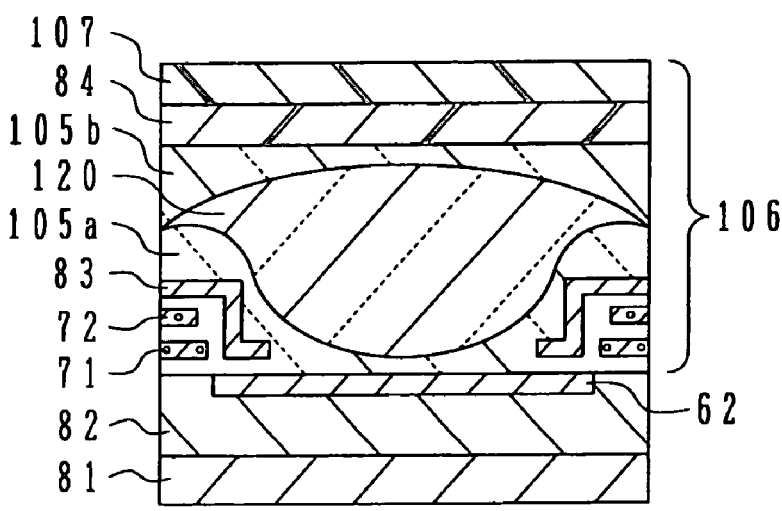

As shown in FIG. 3G, a planarizing layer 107 is formed on the color filters 84 to compensate for the irregular surface of the color filters 84. The planarizing layer 107 is formed by coating transparent photoresist and thermally curing it at a curing temperature of, for example, 220° C. A micro lens support layer 106 is constituted of the light shielding film 83, lower insulating layer 105a, inner lens 120, upper insulating layer 105b, color filters 84 and planarizing layer 107.

Figure 3H:
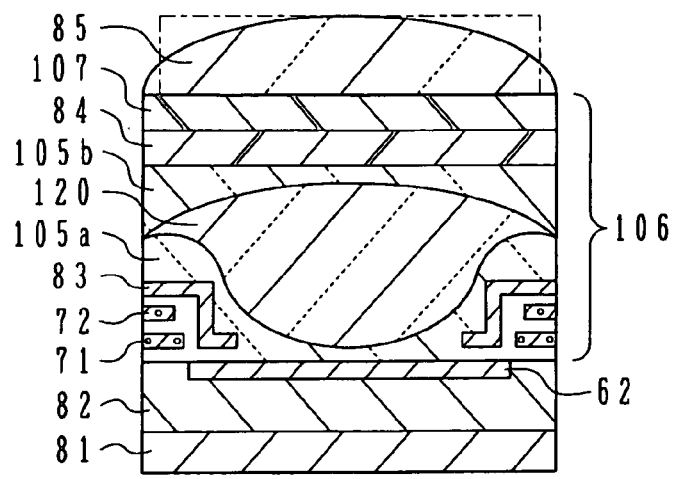

As shown in FIG. 3H, micro lenses 85 are formed on the planarizing layer 107 in the following manner. A photoresist film is coated on the planarizing layer 107, exposed and developed to form lens patterns. In FIG. 3H, the lens patterns are indicated by a one-dot chain line. The lens patterns are subjected to heat treatment at a temperature of 250° C. under a curing temperature of 220° C. to form micro lenses 85. The solid line indicates the micro lenses formed through heat treatment. If necessary, leads are formed.

Figure 3I:
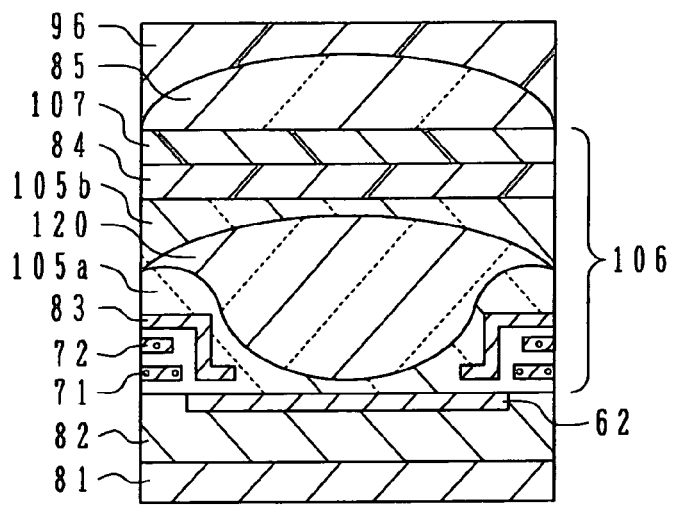

As shown in FIG. 3I, a low refractive index layer 96 is formed covering the micro lenses 85 by coating low refractive index organic material such as fluorine polymer. A glass transition temperature of fluorine polymer is 100° C. to 130° C.

Figure 3J:
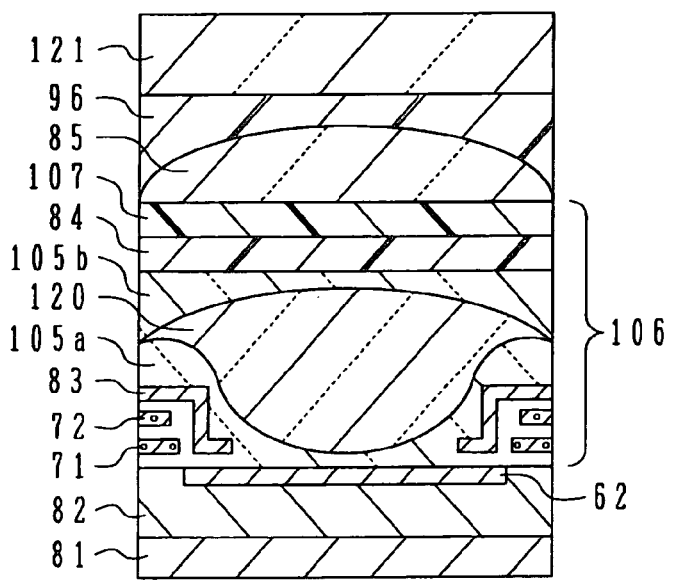

As shown in FIG. 3J, a transparent plate 121 such as a glass plate is disposed on the low refractive index layer 96. Since the low refractive index layer 96 has an adhesive function, the transparent plate 121 can easily be fixed to the low refractive index layer 96. The semiconductor substrate with the transparent plate 121 is packaged to form a packaged solid state imaging device such as shown in FIG. 2C.

Figure 4A:
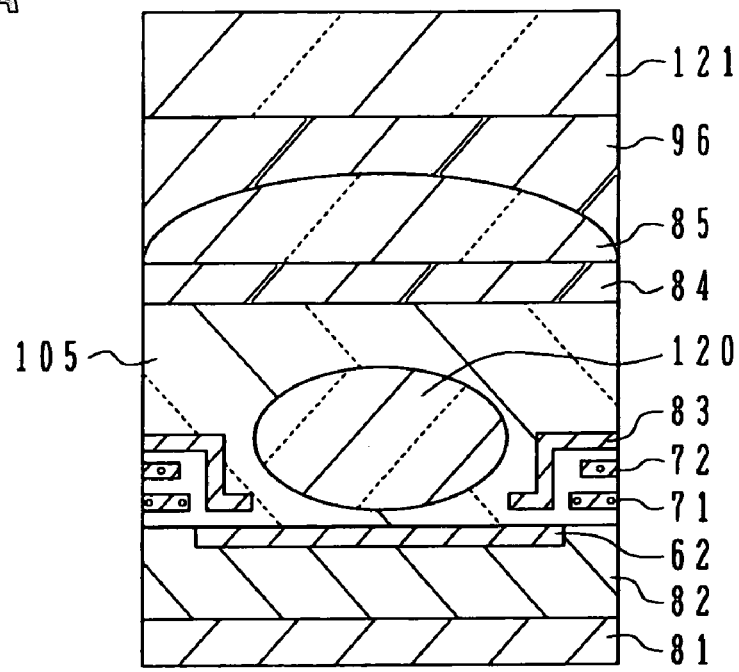
FIG. 4 is a schematic cross sectional view showing a partial area of a pixel arranged area of a solid state imaging device according to a second embodiment.

FIG. 4A is a schematic cross sectional view of a solid state imaging device according to a second embodiment. The shape and position of an inner lens 120 are different from those of the first embodiment shown in FIG. 2B.

The inner lens 120 of the solid state imaging device shown in FIG. 4 has an upward and downward convex shape. The inner lens 120 can converge light incident upon the surface thereof. The inner lens 120 is not positioned above the highest surface of the light shielding film 83.

It is difficult to form the downward convex shape of the inner lens 120 above the highest surface of the light shielding film 83. For example, the downward convex shape of the inner lens manufactured by the method described with reference to FIGS. 3A to 3C has a low degree of curvature of the downward convex shape above the highest surface of the light shielding film 83, resulting in a possible low converging effect. The lower surface of the inner lens 120 above the highest surface of the light shielding film 83 may not have locally the concave shape, so that light cannot be converged and may be scattered.

In the solid state imaging device of the second embodiment, the upward and downward inner lens 120 which has no surface without the converging function, is formed in the area other than the area above the highest surface of the light shielding film 83. This solid state imaging device can realize a high converging efficiency. For example, this inner lens can be formed by etching back the silicon nitride film on the highest surface of the light shielding film in the process shown in FIG. 3B.

Figure 4B:
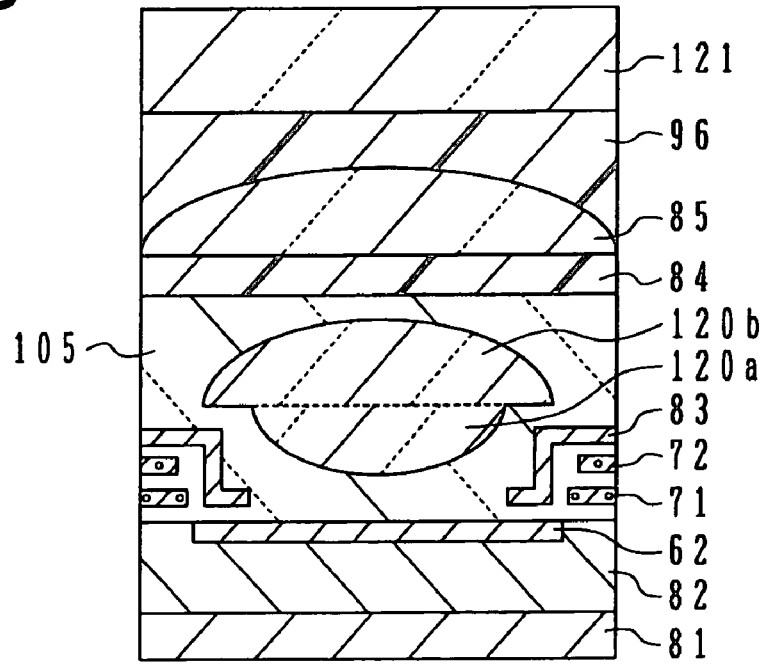

FIG. 4B shows a modification of the solid state imaging device. The same processes as those corresponding to FIG. 4A are performed up to forming the lower convex lens 120a by using the silicon nitride film Thereafter, similar to the processes shown in FIGS. 3C and 3D, a new silicon nitride film is deposited and etched by using resist patterns for upper lenses. The upper convex lens 120b is broader than the lower convex lens 120a. The micro lens 85 makes light be incident upon the upper convex lens 120b, and the upper convex lens 120b progresses the light toward the output surface of the lower convex lens 120a.

The present invention has been described in connection with the preferred embodiments. The invention is not limited only to the above embodiments. It will be apparent to those skilled in the art that other various modifications, improvements, combinations, and the like can be made.

The solid state imaging device described above can be used with a general digital camera. It is suitable for use with a camera built in a portable phone among others. It can be used not only as an area linear sensor but also as a linear sensor.

What we claim are:

1. A solid state imaging device comprising:
   a semiconductor substrate having: photosensors disposed in a matrix shape for photoelectrically converting incident light into signal charges; vertical transfer channels for transferring the signal charges generated in the photosensors in a vertical direction; and a horizontal transfer channel for transferring the signal charges supplied from the vertical transfer channels in a horizontal direction;
   first and second electrodes formed above the vertical transfer channels and extending in a direction crossing the vertical transfer channels;
   a light shielding film formed above said first and second electrodes;
   upward and downward convex inner lenses made of silicon nitride, at the height level above said photosensors and at a process level after forming said light shielding film;
   micro lenses formed above said inner lenses;
   a low refractive index layer covering said micro lenses, said low refractive index layer having a refractive index lower than a refractive index of said micro lenses; and
   a transparent plate disposed on said low refractive index layer.

2. The solid state imaging device according to claim 1, wherein a thickness of said micro lens is 0.5 μm or thinner.

3. The solid state imaging device according to claim 1, further comprising a plurality of leads connected to said semiconductor substrate.

4. The solid state imaging device according to claim 3, further comprising an insulating protection plate adhered to a bottom surface of said semiconductor substrate.

5. The solid state imaging device according to claim 1, wherein said inner lens includes a downward convex lens area and an upward convex lens area.

6. The solid state imaging device according to claim 5, wherein said upward convex area has a plan shape broader than said downward convex lens area.

7. The solid state imaging device according to claim 5, wherein said light shielding film increases a height thereof from a surface of said semiconductor substrate near the openings, and said inner lens is formed inside an area where the height of said light shielding film increases.

* * * * *